(12) United States Patent
Kim et al.

(10) Patent No.: US 8,774,243 B2
(45) Date of Patent: Jul. 8, 2014

(54) DUAL MODE SEMICONDUCTOR LASER AND TERAHERTZ WAVE APPARATUS USING THE SAME

(75) Inventors: Namje Kim, Daejeon (KR); Kyung Hyun Park, Daejeon (KR); Young Ahn Leem, Daejeon (KR); Chul-Wook Lee, Daejeon (KR); Sang-Pil Han, Daejeon (KR); Dong-Hun Lee, Daejeon (KR); Min Yong Jeon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 372 days.

(21) Appl. No.: 13/022,985

(22) Filed: Feb. 8, 2011

(65) Prior Publication Data

US 2012/0051386 A1    Mar. 1, 2012

(30) Foreign Application Priority Data

Aug. 31, 2010 (KR) ......................... 10-2010-0084922

(51) Int. Cl.
*H01S 5/00* (2006.01)
(52) U.S. Cl.
USPC .................... 372/50.1; 372/43.01; 372/50.11; 372/96
(58) Field of Classification Search
CPC ......... H01S 5/12; H01S 5/4087; H01S 5/026; H01S 5/06256; H01S 5/34306; H01S 5/06258; H01S 5/0612; H01S 5/1228; H01S 5/0268; H01S 5/02415; H01S 5/02453; H01S 5/02461; H01S 5/125; H01S 5/141; H01S 5/1231; H01S 5/187; H01S 5/1092; H01S 5/1221; H01S 3/0675

USPC .............................. 372/96, 43.01, 50.11, 50.1
See application file for complete search history.

(56) References Cited

U.S. PATENT DOCUMENTS 4,856,005 A * 8/1989 Oe et al. .......................... 372/20
5,642,371 A * 6/1997 Tohyama et al. ........... 372/45.01
(Continued)

FOREIGN PATENT DOCUMENTS

EP         1489707        12/2004
JP       10075016 A       3/1998
(Continued)

OTHER PUBLICATIONS

S. Li et al. "Analysis of Surface-Emitting Second-Order Distributed Feedback Lasers With Central Grating Phaseshift" IEEE Journal of Selected Topics in Quantum Electronics, vol. 9, No. 5, Sep./Oct. 2003 pp. 1153-1165.*

(Continued)

*Primary Examiner* — Jessica Stultz
*Assistant Examiner* — Delmar R Forde
(74) *Attorney, Agent, or Firm* — Rabin & Berdo, P.C.

(57) ABSTRACT

Provided are a dual mode semiconductor laser and a terahertz wave apparatus using the same. The dual mode semiconductor laser includes a distributed feedback laser structure section including a first diffraction grating on a substrate and a distributed Bragg reflector laser structure section including a second diffraction grating on the substrate. A first wavelength oscillated by the distributed feedback laser structure section and a second wavelength oscillated by the distributed Bragg reflector laser structure section are different from each other, and the distributed feedback laser structure section and the distributed Bragg reflector laser structure section share the same gain medium with each other.

12 Claims, 5 Drawing Sheets

(56) References Cited

U.S. PATENT DOCUMENTS

| | | | |
|---|---|---|---|
| 6,810,053 B1* | 10/2004 | Botez et al. | 372/45.01 |
| 7,130,325 B2 | 10/2006 | Oh et al. | |
| 8,213,478 B2* | 7/2012 | Park et al. | 372/50.11 |
| 2004/0218639 A1* | 11/2004 | Oh et al. | 372/20 |
| 2005/0031002 A1* | 2/2005 | Botez | 372/50 |
| 2007/0104242 A1* | 5/2007 | Kudo et al. | 372/96 |
| 2010/0142571 A1* | 6/2010 | Park et al. | 372/26 |
| 2010/0158056 A1* | 6/2010 | Shin et al. | 372/29.016 |
| 2010/0265980 A1* | 10/2010 | Matsuda | 372/46.01 |
| 2011/0149368 A1* | 6/2011 | Kim et al. | 359/276 |
| 2011/0292960 A1* | 12/2011 | Shoji et al. | 372/50.11 |
| 2012/0147907 A1* | 6/2012 | Kim et al. | 372/4 |

FOREIGN PATENT DOCUMENTS

| | | | |
|---|---|---|---|
| JP | 11340566 A | 12/1999 | |
| JP | 2004-336002 A | 11/2004 | |
| KR | 2004-0032375 A | 4/2004 | |
| KR | 2004-0094190 A | 11/2004 | |
| KR | 2009-0092143 A | 8/2009 | |

OTHER PUBLICATIONS

N. Carlson et al. "Mode Discrimination in Distributed Feedback Grating Surface Emitting Laser Containing a Buried Second-Order Grating" IEEE Journal of Quantum Electronics. vol. 27, No. 6, Jun. 1991, pp. 1746-1752.*

G. Witjaksono et al. "Surface-emitting, single-lobe operation from second-order distributed-reflector lasers with central grating phaseshift" Applied Physics Letters vol. 78, No. 26 Jun. 25, 2001, pp. 4088-4090.*

* cited by examiner

DUAL MODE SEMICONDUCTOR LASER AND TERAHERTZ WAVE APPARATUS USING THE SAME

CROSS-REFERENCE TO RELATED APPLICATIONS

This U.S. non-provisional patent application claims priority under 35 U.S.C. §119 of Korean Patent Application No. 10-2010-0084922, filed on Aug. 31, 2010, the entire contents of which are hereby incorporated by reference.

BACKGROUND OF THE INVENTION

The present invention disclosed herein relates to a semiconductor laser, and more particularly, to a dual mode semiconductor laser and a terahertz wave apparatus using the same.

Many researches with respect to a terahertz (THz) wave having a frequency band of about 0.1 THz to about 10 THz are being conducted in recent years. The terahertz wave has proper characteristics as followings. The terahertz is harmless to humans due to its low energy. Also, many molecules have their proper spectrums in a terahertz wave band. A time-domain spectroscopy (TDS) system using a femtosecond (fs) laser was mainly used as a terahertz wave generation apparatus.

The TDS system excites carriers in a photoconductive switch of a photomixer using the femtosecond laser. The photoconductive switch is formed of a material having a very short carrier lifetime. As a result, a current having femtosecond pluses flows into an antenna. Here, when the pulse-type current flows into the integrated antenna, a THz wave having a broad band is generated and is propagated through the air. Thus, the TDS system basically uses the pulse-type THz wave. However, there is a disadvantage in that the femtosecond (fs) laser has a large size and expensive. In case of various applications used in fields, a system, which has a small size and portable and may obtain results in a frequency band using a THz continuous wave (CW THz), but a time-domain spectroscopy, is useful.

Thus, a photomixing method using a photoconductive antenna or a photomixer and a laser having two wavelengths different from each other is being widely researched to realize field applications or micro systems.

The photomixing method basically uses a beating signal generated by the two lasers different from each other. A beating signal having a THz frequency is generated using two laser signals having wavelengths different from each other to generate an AC current having the THz frequency using the generated beating signal. Here, the antenna integrated in the photomixer generates the THz wave. Accordingly, the generated THz wave has the same frequency as that of the beating signal. Therefore, the THz wave generation apparatus, which is frequency-tunable by adjusting one of the wavelengths of the two lasers, may be manufactured.

In case of a THz continuous wave (CW THz) generator/detector, which is commercially sold at the present time, two independent distributed-feedback (DFB) lasers are used. Outputs of the two DFB lasers, which are operated in wavelengths different from each other, are beaten while overlapping each other in an optical fiber or space. Thus, the CW THz generator/detector uses this phenomenon to generate the THz wave. A frequency variable THz wave generation apparatus in which an operation wavelength of two or one laser is varied to change or to tune the frequency of the THz wave may be manufactured.

Here, one of important physical properties is that stability of the frequency of the generated THz wave depends on wavelength stability of the two lasers used for generating the beating signal. Thus, a noise such as fluctuation of the wavelength of each of the lasers may cause fluctuation of the frequency of THz wave as it is. If the two lasers have wavelengths, which exactly accord with each other in a degree and direction fluctuated by external parameters (e.g., a temperature, an electrical characteristic, or a mechanical vibration), the frequency of the generated THz wave may be stable even though characteristics of the two lasers are not stable.

When two independent lasers are used, there is a limitation that a high expensive wavelength locker should be used in case of a commercial system to minimize instability of the frequency of the THz wave generated through the photomixing method.

SUMMARY OF THE INVENTION

The present invention provides a dual mode semiconductor laser having a stable operation characteristic and a terahertz wave apparatus using the same.

Embodiments of the present invention provide dual mode semiconductor lasers including: a distributed feedback laser structure section including a first diffraction grating on a substrate; and a distributed Bragg reflector laser structure section including a second diffraction grating on the substrate, wherein a first wavelength oscillated by the distributed feedback laser structure section and a second wavelength oscillated by the distributed Bragg reflector laser structure section are different from each other, and the distributed feedback laser structure section and the distributed Bragg reflector laser structure section share the same gain medium with each other.

In some embodiments, the dual mode semiconductor lasers may further include a phase controller between the distributed feedback laser structure section and the distributed Bragg reflector laser structure section.

In other embodiments, the first diffraction grating may have the same period as that of the second diffraction grating.

In still other embodiments, the distributed feedback laser structure section may include an upper clad layer including the first diffraction grating and an active optical waveguide including the gain medium, and the distributed Bragg reflector laser structure section may include a passive optical waveguide including the second diffraction grating, wherein the active optical waveguide may have an effective refractive index different from that of the passive optical waveguide.

In even other embodiments, the distributed feedback laser structure section may further include a first micro-heater disposed on the upper clad layer.

In yet other embodiments, the first micro-heater may change the effective refractive index of the active optical waveguide and the first wavelength.

In further embodiments, the distributed Bragg reflector laser structure section may further include a second micro-heater disposed on the passive optical waveguide.

In still further embodiments, the second micro-heater may change the effective refractive index of the passive optical waveguide and the second wavelength.

In even further embodiments, the first diffraction grating may have a period different from that of the second diffraction grating.

In yet further embodiments, the distributed feedback laser structure section may include: a lower clad layer on the substrate; an active optical waveguide including the gain medium on the lower clad layer; and an upper clad layer including the first diffraction grating on the active optical waveguide.

In much further embodiments, the distributed Bragg reflector laser structure section may include: the lower clad layer on the substrate; a passive optical waveguide including the second diffraction grating on the lower clad layer; and the upper clad layer on the passive optical waveguide.

In other embodiments of the present invention, terahertz wave apparatuses include: a dual mode semiconductor laser including distributed feedback laser structure section oscillating a first wavelength on a substrate and a distributed Bragg reflector laser structure section oscillating a second wavelength; and a photomixer generating a terahertz wave using light oscillated from the dual mode semiconductor laser, wherein the distributed feedback laser structure section and the distributed Bragg reflector laser structure section share the same gain medium with each other.

In some embodiments, the distributed feedback laser structure section may include a first diffraction grating, and the distributed Bragg reflector laser structure section may include a second diffraction grating.

In other embodiments, the distributed feedback laser structure section may include: a lower clad layer on the substrate; an active optical waveguide including the gain medium on the lower clad layer; and an upper clad layer including the first diffraction grating on the active optical waveguide.

In still other embodiments, the distributed Bragg reflector laser structure section may include: the lower clad layer on the substrate; a passive optical waveguide including the second diffraction grating on the lower clad layer; and the upper clad layer on the passive optical waveguide.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Figure 1:
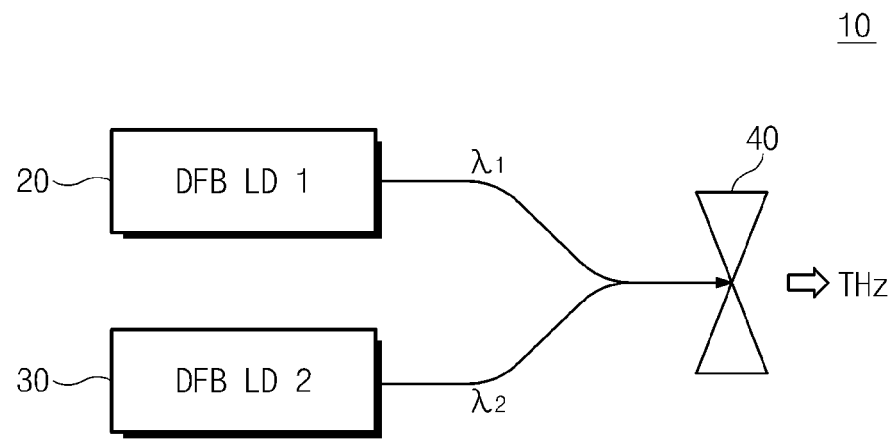
FIG. 1 is a schematic view of a typical terahertz wave apparatus including two independent lasers.

Objects, other objects, characteristics and advantages of the present invention will be easily understood from an explanation of a preferred embodiment that will be described in detail below by reference to the attached drawings. The present invention may, however, be embodied in different forms and should not be construded as limited to the embodiments set forth herein. Rather, these embodiments are provided so that this disclosure will be thorough and complete, and will fully convey the scope of the present invention to those skilled in the art.

In the following description, it will be understood that when a layer (or film) is referred to as being on another layer or substrate, it can be directly on the other layer or substrate, or intervening layers may also be present. In the drawings, like reference numerals refer to like elements throughout.

Additionally, the embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. Also, though terms like a first and a second are used to describe various members, components, regions, layers, and/or portions in various embodiments of the present invention, the members, components, regions, layers, and/or portions are not limited to these terms. These terms are used only to differentiate one member, component, region, layer, or portion from another one. An embodiment described and exemplified herein includes a complementary embodiment thereof.

In the following description, the technical terms are used only for explain a specific exemplary embodiment while not limiting the present invention. The terms of a singular form may include plural forms unless referred to the contrary. The meaning of "include," "comprise," "including," or "comprising," specifies a property, a region, a fixed number, a step, a process, an element and/or a component but does not exclude other properties, regions, fixed numbers, steps, processes, elements and/or components.

FIG. 1 is a schematic view of a typical terahertz wave apparatus including two independent lasers.

Referring to FIG. 1, a terahertz wave apparatus 10 includes a first distributed-feedback (DFB) laser diode 20 and a second DFB laser diode 30, and a photomixer 40. Here the first DFB laser diode 20 and the second DFB laser diode are independent from each other. The first and second DFB diodes 20 and 30 may be used as beating sources for generating a continuous terahertz wave (CW THz). One or two operation wavelengths of the first and second DFB laser diodes 20 and 30 may adjust to tune a frequency of a beating signal generated by two wavelengths λ1 and λ2.

The beating signal generated by the first and second DFB laser diodes and 30 is inputted into the photomixer 40 to generate an AC current having a frequency of a terahertz band. The AC current generated in the photomixer 40 generates a terahertz wave by an antenna (not shown) integrated in the photomixer 40.

However, since the terahertz wave apparatus 10 uses the first and second DFB laser diodes 20 and 30, which are independent from each other, a noise such as fluctuation of the wavelength of each of the first and second DFB laser diodes 20 and 30 causes fluctuation of the frequency of the terahertz wave. Thus, stability of the terahertz wave apparatus 10 may be deteriorated.

Figure 2:
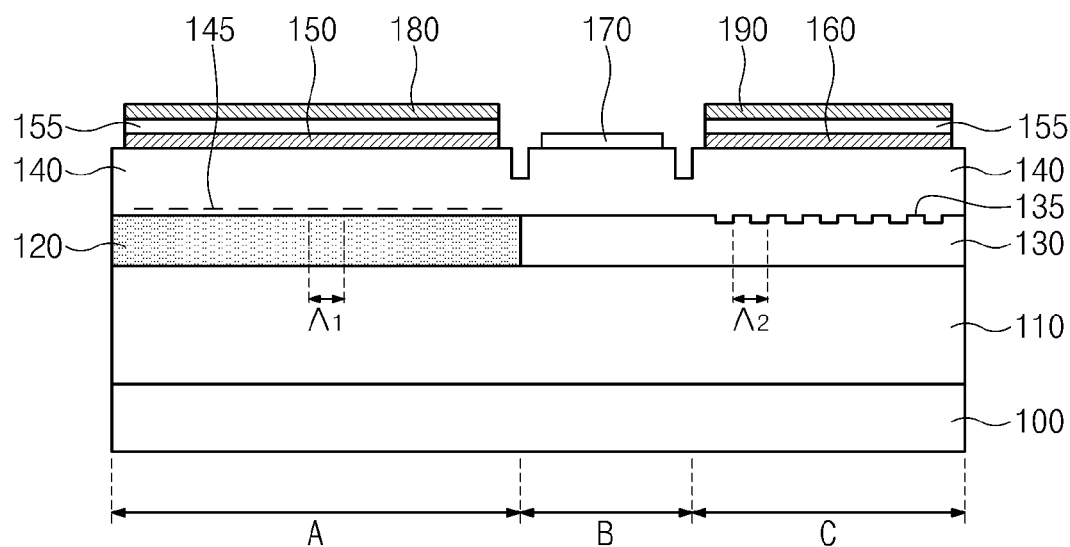
FIG. 2 is a conceptual view of a dual mode semiconductor laser according to an embodiment of the inventive concept.

FIG. 2 is a conceptual view of a dual mode semiconductor laser according to an embodiment of the inventive concept.

Referring to FIG. 2, a dual mode semiconductor laser includes a DFB laser structure section A and a distributed Bragg reflector (DBR) laser structure section C. The DFB laser structure section A includes a first diffraction grating 145 disposed on a substrate 100. The DFB laser structure section C is a second diffraction grating 135 disposed on the substrate 100. The first wavelength λ1 oscillated by the DFB laser structure section A and the second wavelengths λ2 oscillated by the DBR laser structure section C are different from each other. The DFB laser structure section A and the DBR laser structure section C share the same gain medium with each other.

The first diffraction grating 145 serves as a filter, which selectively reflects light. The DFB laser structure section A includes an active optical waveguide. The DFB laser structure section A obtains a gain from the gain medium of the active optical waveguide 120. Also, the DFB laser structure section oscillates the first wavelength λ1 selected by the first diffraction grating 145. Hereinafter, a mode oscillated by the DFB laser structure section A will be referred to as a DFB mode.

The DBR laser structure section C obtains a gain from the gain medium of the active optical waveguide 120. Also, the DBR laser structure section oscillates the second wavelength λ2 selected by the second diffraction grating 135. That is, although the DBR laser structure section C and the DFB laser structure section A share the same gain medium with each other and the DBR laser structure section C obtains the gain from the active optical waveguide 120, the oscillated second wavelength λ2 is determined by the second diffraction grating 135. Hereinafter, a mode oscillated by the DBR laser structure section C will be referred to as a DBR mode.

Since the DFB mode and the DBR mode use the same active optical waveguide 120 and share a resonator with each other, the DFB mode and the DBR mode may coexist with each other within a single resonator. Thus, the phenomenon in which the gain of the gain medium of the active optical waveguide 120 is unstable by external parameters (e.g., a temperature, an electrical characteristic, or a mechanical vibration) may also occur in the DFB mode and the DBR mode. Thus, since the degree and direction of fluctuation of the operation wavelength in the DFB mode and the DBR mode accord with each other, the dual mode laser diode consisted of the DFB laser structure section A and the DBR laser structure section C may be adequate for the beating sources used for generating the terahertz wave.

According to the current embodiment, it may be understood that two laser light for generating the beating source are outputted through a single device. The wavelength fluctuation due to the external parameters exactly accords with each other in the two laser light. Thus, the frequency of the terahertz (THz) wave may be stabilized. This is referred to as a common-mode noise rejection effect.

A phase controller B may be disposed between the DFB laser structure section A and the DBR laser structure section C. The phase controller B may determine the second wavelength λ2. The phase controller B may control the feedback from the second diffraction grating 135 by a phase current supplied from a phase control electrode 170.

The DFB laser structure section A may include a lower clad layer 110 on the substrate 100, the active optical waveguide 120 on the lower clad layer 110, an upper clad layer 140 including the first diffraction grating 145 on the active optical waveguide 120, and a first current injection electrode 150 on the upper clad layer 140. A dielectric layer 155 and a first micro-heater electrode 180 may be further disposed on the first current injection electrode 150.

The DBR laser structure section C may include the lower clad layer 110 on the substrate 100, a passive optical waveguide 130 including the second diffraction grating 135 on the lower clad layer 110, the upper clad layer 140 on the passive optical waveguide 130, and a second current injection electrode 160 on the upper clad layer 140. The dielectric layer 155 and a second micro-heater electrode 190 may be further disposed on the second current injection electrode 160.

The phase controller B may include the lower clad layer 110 on the substrate 100, the passive optical waveguide 130 on the lower clad layer 110, and the upper clad layer 140 on the passive optical waveguide 130.

The substrate 100 may be formed of an n-type InP. An n-type electrode (not shown) may be disposed on an under surface of the substrate 100. The lower clad layer 110 may be formed of an n-type InP. Each of the active optical waveguide 120 and the passive optical waveguide 130 may be formed of InGaAsP.

The upper clad layer 140 may be formed of a p-type InP. Each of the first current injection electrode 150, the second current injection electrode 160, the first micro-heater electrode 180, and the second micro-heater electrode 190 may be formed of a conductive material, e.g., a metal.

The first diffraction grating 145 may have a first period Λ1 equal to a second period Λ2 of the second diffraction grating 135. Here, the periods Λ1 and Λ2 of the first and second diffraction gratings 145 and 135 represent a distance between peaks adjacent to each other. When the first period Λ1 is equal to the second period Λ2, the active optical waveguide 120 has an effective refractive index different from that of the passive optical waveguide 130. Since the active optical waveguide 120 has the effective refractive index different from that of the passive optical waveguide 130, the first wavelength λ1 and the second wavelength λ2 may be different from each other. Also, when the first period Λ1 and the second Λ2 are different from each other, the first wavelength λ1 and the second wavelength λ2 may be different from each other.

The first current injection electrode 150 may determine a laser output by injecting a current into the gain medium of the active optical waveguide 120. The first micro-heater electrode 180 may change the effective refractive index of the active optical waveguide 180. Thus, the first wavelength λ1 may be tuned.

The second current injection electrode 160 may change the effective refractive index of the passive optical waveguide 130. This uses a free carrier plasma effect. Alternatively, the second micro-heater electrode 190 may change the effective refractive index of the passive optical waveguide 130. The second wavelength λ2 may be tuned by the second current injection electrode 160 and the second micro-heater electrode 190.

Figure 3:
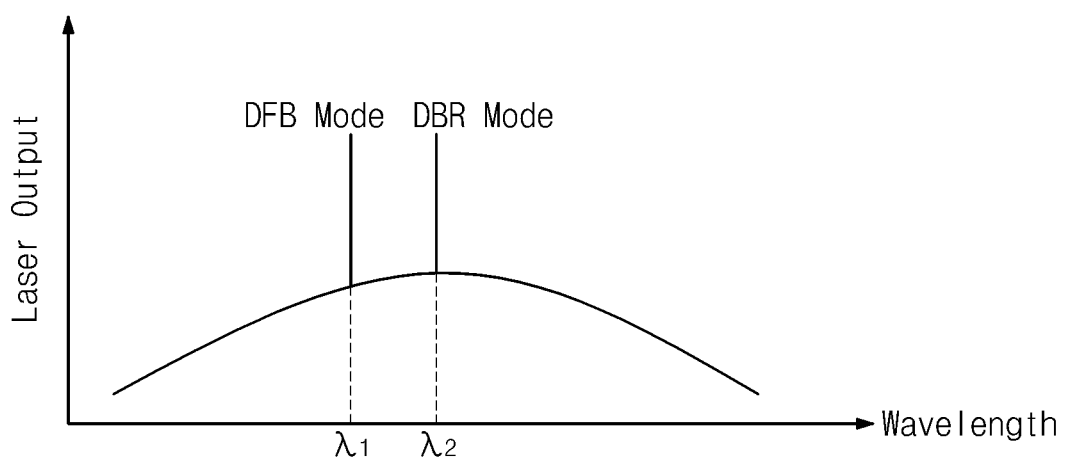
FIG. 3 is a graph for explaining that a DFB mode and a DBR mode oscillate wavelengths difference from each other according to an embodiment of the inventive concept.

FIG. 3 is a graph for explaining that a DFB mode and a DBR mode oscillate wavelengths difference from each other according to an embodiment of the inventive concept.

Referring to FIG. 3, a transverse axis represents a wavelength, and a longitudinal axis represents a laser output. A wavelength oscillated in the DFB mode is λ1, and a wavelength oscillated in the DBR mode is λ2. As described above, the first wavelength λ1 of the DFB mode and the second wavelength λ2 of the DBR mode may be determined by the grating period or the effective refractive index. Since the first wavelength λ1 of the DFB mode and the second wavelength λ2 of the DBR mode are oscillated in the single resonator, the dual mode semiconductor laser according to an embodiment of the inventive concept may be adequate as the beating source of the terahertz wave apparatus.

Figure 4:
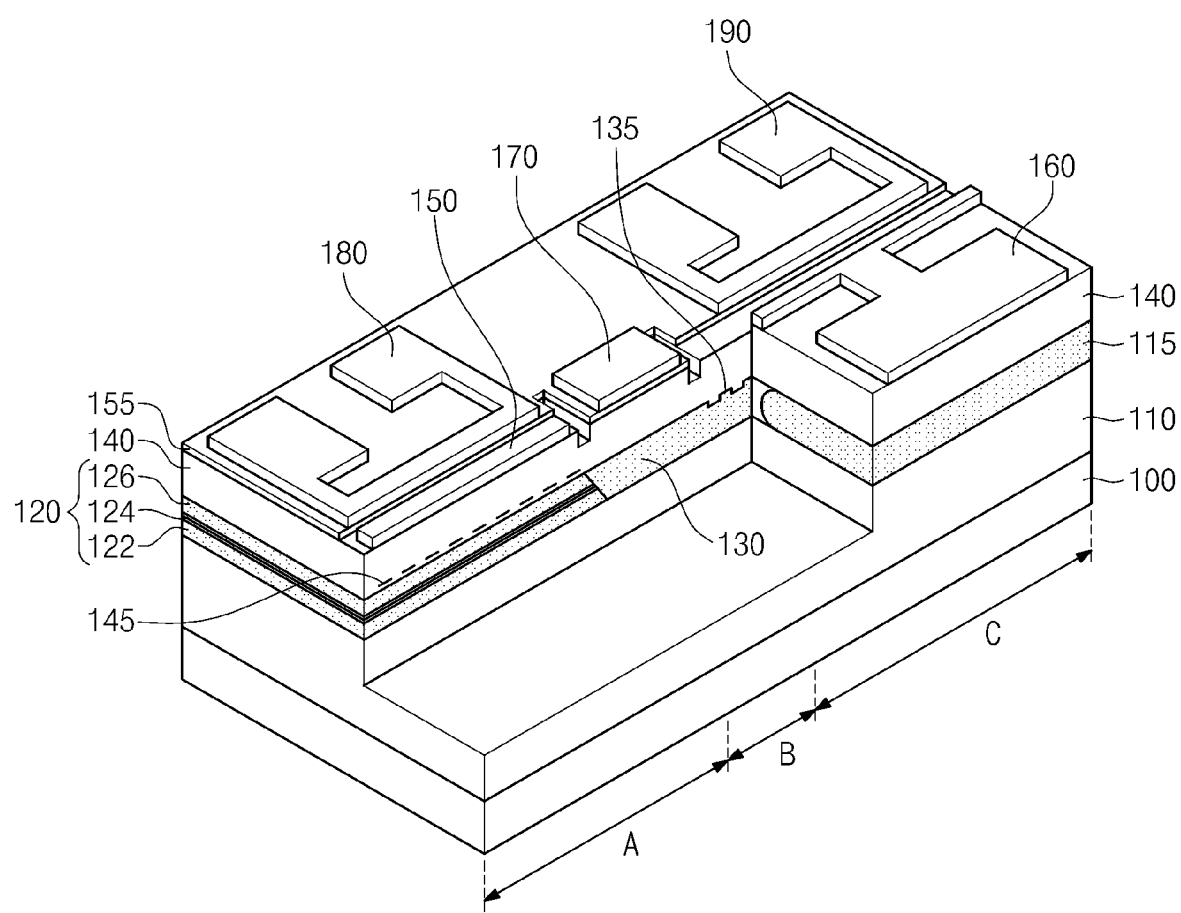
FIG. 4 is a perspective view of a dual mode semiconductor laser according to embodiments of the inventive concept.

FIG. 4 is a perspective view of a dual mode semiconductor laser according to embodiments of the inventive concept.

Referring to FIG. 4, a dual mode semiconductor laser includes a DFB laser structure section A and a DBR laser structure section C. A phase controller B may be disposed between the DFB laser structure section A and the DBR laser structure section C.

The DFB laser structure section A may include a lower clad layer 110 on a substrate 100, an active optical waveguide 120 on the lower clad layer 110, an upper clad layer 140 including a first diffraction grating 145 on the active optical waveguide 120, and a first current injection electrode 150 on the upper clad layer 140. A dielectric layer 155 may be disposed on the upper clad layer 140. A first micro-heater electrode 180 may be disposed on the dielectric layer 155. The first current injection electrode 150 may be disposed horizontally spaced from the first micro-heater electrode 180. Alternatively, the first current injection electrode 150 and the first micro-heater electrode 180 may be vertically spaced from each other with the dielectric layer 155 being disposed therebetween. The active optical waveguide 120 may include a lower carrier barrier 122, an active layer 124 (a gain layer such as a quantum well), and an upper carrier barrier 126, which are sequentially stacked with each other, to improve performance of the laser.

The DBR laser structure section C may include the lower clad layer 110 on the substrate 100, a passive optical waveguide 130 including the second diffraction grating 135 on the lower clad layer 110, the upper clad layer 140 on the passive optical waveguide 130, and a second current injection electrode 160 on the upper clad layer 140. The dielectric layer 155 may be disposed on the upper clad layer 140, and a second micro-heater electrode 190 may be disposed on the dielectric layer 155. Alternatively, the dielectric layer 155 and the second micro-heater electrode 190 may be sequentially stacked on the second current injection electrode 160.

A current blocking layer 115 may be disposed on the dual mode semiconductor laser. The current blocking layer 115 may have a structure in which a p-InP layer, an n-InP layer, and a p-InP layer are sequentially stacked.

The phase controller B may include the lower clad layer 110 on the substrate 100, the passive optical waveguide 130 on the lower clad layer 110, and the upper clad layer 140 on the passive optical waveguide 130.

The substrate 100 may be formed of an n-type InP. An n-type electrode (not shown) may be disposed on an under surface of the substrate 100. The lower clad layer 110 may be formed of an n-type InP. Each of the active optical waveguide 120 and the passive optical waveguide 130 may be formed of InGaAsP. The active optical waveguide 120 includes a gain medium such as a multi-quantum well structure including a well and a barrier. The upper clad layer 140 may be formed of a p-type InP. Each of the first current injection electrode 150, the second current injection electrode 160, the first micro-heater electrode 180, and the second micro-heater electrode 190 may be formed of a conductive material, e.g., a metal.

The upper clad layer 140 of the DFB laser structure section A includes the first diffraction grating 145. The passive optical waveguide 130 of the DBR laser structure section C includes the second diffraction grating 135. A first wavelength λ1 oscillated by the DFB laser structure section A is different from a second wavelength λ2 oscillated by the DBR laser structure section C.

The DFB laser structure section A obtains a gain from the gain medium of the active optical waveguide 120. Also, the DFB laser structure section oscillates the first wavelength λ1 selected by the first diffraction grating 145. Hereinafter, a mode oscillated by the DFB laser structure section A will be referred to as a DFB mode.

The DBR laser structure section C obtains a gain from the gain medium of the active optical waveguide 120. Also, the DBR laser structure section oscillates the second wavelength λ2 selected by the second diffraction grating 135. That is, although the DBR laser structure section C obtains the gain from the active optical waveguide 120 equal to that of the DFB laser structure section, the oscillated second wavelength λ2 is determined by the second diffraction grating 135. Hereinafter, a mode oscillated by the DBR laser structure section C will be referred to as a DBR mode.

Since the DFB mode and the DBR mode use the same active optical waveguide 120 and share a resonator with each other, the DFB mode and the DBR mode may coexist with each other within a single resonator. Thus, the phenomenon in which the gain of the gain medium of the active optical waveguide 120 is fluctuated by external parameters (e.g., a temperature, an electrical characteristic, or a mechanical vibration) may also occur in the DFB mode and the DBR mode. Thus, since the degree and direction fluctuated in the DFB mode and the DBR mode accord with each other, the DFB laser structure section A and the DBR laser structure section C may be adequate for the beating sources used for generating the terahertz wave even though characteristics of the DFB laser structure section A and the DBR laser structure section C are instable.

The first diffraction grating 145 may have a first period Λ1 equal to a second period Λ2 of the second diffraction grating 135. Here, the periods Λ1 and Λ2 of the first and second diffraction gratings 145 and 135 represent a distance between peaks adjacent to each other. When the first period Λ1 is equal to the second period Λ2, the active optical waveguide 120 has an effective refractive index different from that of the passive optical waveguide 130. Since the active optical waveguide 120 has the effective refractive index different from that of the passive optical waveguide 130, the first wavelength λ1 and the second wavelength λ2 may be different from each other. Also, when the first period Λ1 and the second Λ2 are different from each other, the first wavelength λ1 and the second wavelength λ2 may be different from each other.

The first current injection electrode 150 may determine a laser output by injecting a current into the gain medium of the active optical waveguide 120. The first micro-heater electrode 180 may change the effective refractive index of the active optical waveguide 180. Thus, the first wavelength λ1 may be tuned.

The second current injection electrode 160 may change the effective refractive index of the passive optical waveguide 130. This uses a free carrier plasma effect. Alternatively, the second micro-heater electrode 190 may change the effective refractive index of the passive optical waveguide 130. The second wavelength λ2 may be tuned by the second current injection electrode 160 and the second micro-heater electrode 190.

The phase controller B may determine the second wavelength λ2. The phase controller B may control the feedback from the second diffraction grating 135 by a phase current supplied from a phase control electrode 170.

According to an embodiment of the inventive concept, the DFB mode and the DBR mode may be oscillated by a single resonator structure. Since the first wavelength λ1 of the DFB mode may be tuned by the first micro-heater electrode 180, the second wavelength λ2 of the DBR mode may be tuned by the second micro-heater electrode 190 and the second current injection electrode 160.

Figure 5A:
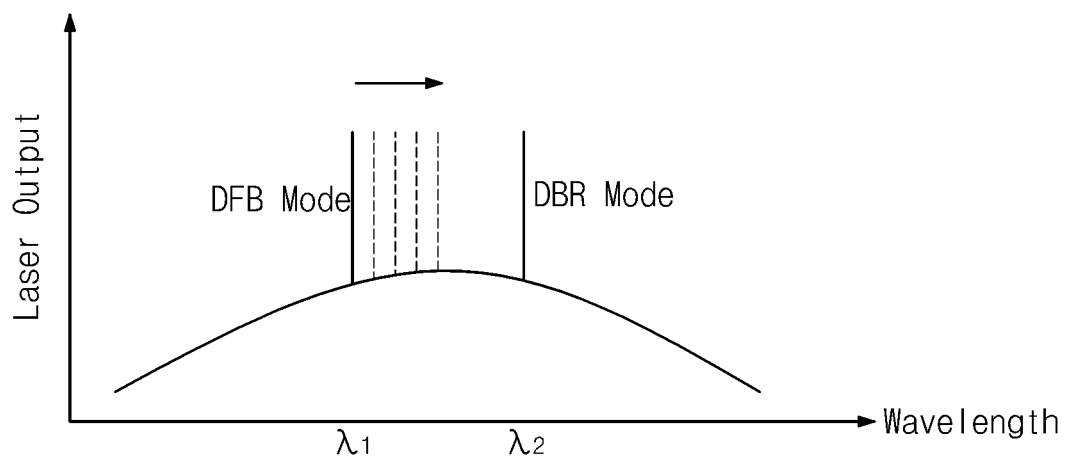
FIGS. 5A to 5C are graphs for explaining a tuning operation of a wavelength according to embodiments of the inventive concept.
Figure 5B:
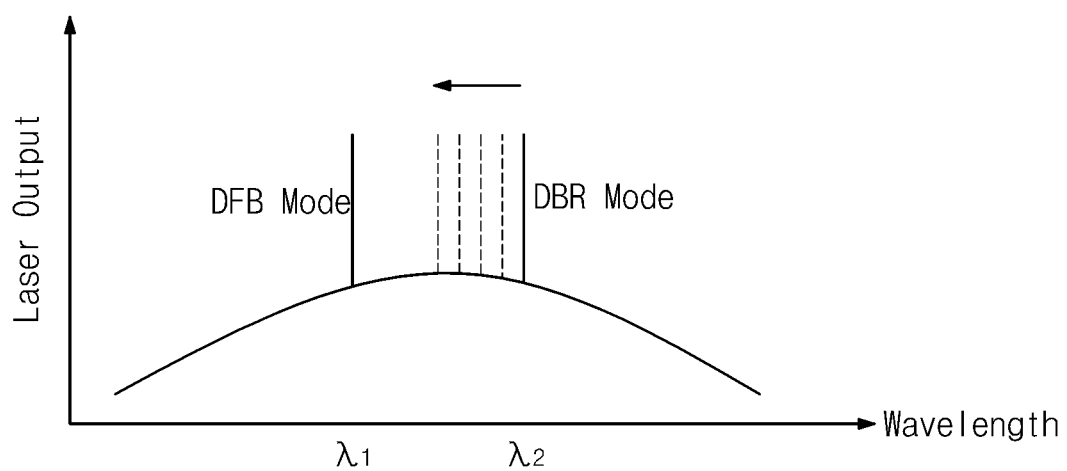
Figure 5C:
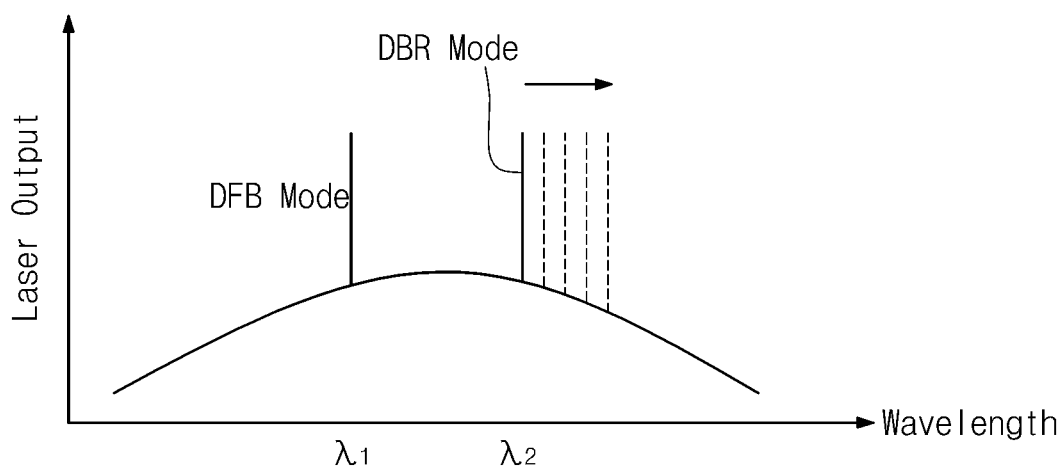

FIGS. 5A to 5C are graphs for explaining a tuning operation of a wavelength according to embodiments of the inventive concept. In FIGS. 5A to 5C, a transverse axis represents a wavelength, and a longitudinal axis represents a laser output.

FIG. 5A illustrates a result in which the first wavelength λ1 of the DFB mode is tuned using the first micro-heater electrode 180 described above. The first micro-heater electrode 180 changes the first wavelength λ1 toward a long wavelength. The first wavelength λ1 of the DFB mode may be adjusted and the second wavelength λ2 of the DBR mode may be fixed to adjust the frequency of the terahertz wave.

FIG. 5B illustrates a graph in which the second wavelength λ2 of the DBR mode is tuned using the second current injection electrode 160 described above. The second wavelength λ2 is changed toward a short wavelength using the second current injection electrode 160. The first wavelength λ1 of the DFB mode may be fixed and the second wavelength λ2 of the DBR mode may be adjusted to adjust the frequency of the terahertz wave.

FIG. 5C illustrates a graph in which the second wavelength λ2 of the DBR mode is tuned using the second micro-heater electrode 190 described above. The second wavelength λ2 is changed toward a long wavelength using the second micro-heater electrode 190. The first wavelength λ1 of the DFB mode may be fixed and the second wavelength λ2 of the DBR mode may be adjusted to adjust the frequency of the terahertz wave.

Figure 6:
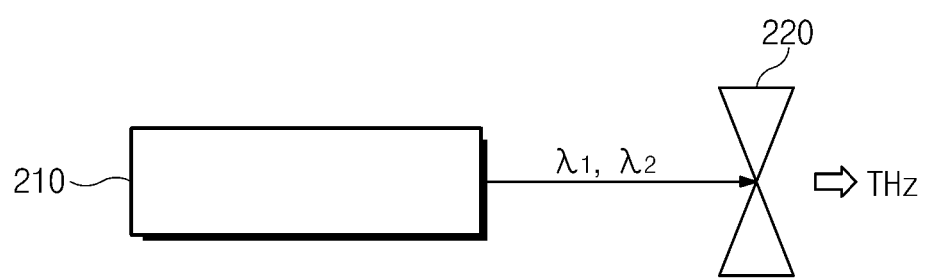
FIG. 6 is a conceptual view of a terahertz wave apparatus according to an embodiment of the inventive concept.

FIG. 6 is a conceptual view of a terahertz wave apparatus according to an embodiment of the inventive concept.

Referring to FIG. 6, a terahertz wave apparatus 200 includes a dual mode semiconductor laser 210 and a photomixer 220. The dual mode semiconductor laser 210 may include the same component as that of the above-described embodiments. That is, the dual mode semiconductor laser 210 includes a DFB laser structure section oscillating a first wavelength λ1 and a DBR laser structure section oscillating a second wavelength λ2. The DBR laser structure section and the DFB laser structure section share the same gain medium with each other. The dual mode semiconductor laser 210 oscillates a beating source of a terahertz (THz) wave. The photomixer 220 generates the terahertz wave using light oscillated from the dual mode semiconductor laser 210.

As show in FIG. 2, the DBR laser structure section may include a lower clad layer on the substrate, an active optical waveguide on the lower clad layer, an upper clad layer including a first diffraction grating on the active optical waveguide, a first current injection electrode on the upper clad layer 140, and a first micro-heater electrode.

The DBR laser structure section may include the lower clad layer on the substrate, a passive optical waveguide including a second diffraction grating on the lower clad layer, the upper clad layer on the passive optical waveguide, a second current injection electrode on the upper clad layer, and a second micro-heater electrode.

The dual mode semiconductor laser 210 includes the DBR laser structure section and the DBR laser structure section within a single resonator. The degree and direction fluctuated by external parameters accord with each other in the DFB mode and the DBR mode to stabilize characteristics of the two laser structure sections. Thus, the frequency of the terahertz wave may be stabilized.

According to the embodiments of the inventive concept, since the DFB mode and the DBR mode use the same gain medium (or active optical waveguide) and share the resonator with each other, the DFB mode and the DBR mode may coexist with each other within the single resonator. In the DFB laser structure section and the DBR laser structure section, the degree and direction fluctuated by the external parameters may accord with each other. The dual mode semiconductor laser may be adequate for the beating source of the terahertz wave, and the frequency of the terahertz wave may be stabilized.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A dual mode semiconductor laser, comprising:
a distributed feedback laser structure section comprising a first diffraction grating on a substrate; and
a distributed Bragg reflector laser structure section comprising a second diffraction grating on the substrate,
wherein a first wavelength oscillated by the distributed feedback laser structure section and a second wavelength oscillated by the distributed Bragg reflector laser structure section are different from each other, and the distributed feedback laser structure section and the distributed Bragg reflector laser structure section share a same gain medium with each other,
wherein the distributed Bragg reflector laser structure section further comprises:
a lower clad layer on the substrate;
a passive optical waveguide comprising the second diffraction grating on the lower clad layer; and
an upper clad layer on the passive optical waveguide.

2. The dual mode semiconductor laser of claim 1, further comprising a phase controller between the distributed feedback laser structure section and the distributed Bragg reflector laser structure section.

3. The dual mode semiconductor laser of claim 1, wherein the first diffraction grating has the same period as that of the second diffraction grating.

4. The dual mode semiconductor laser of claim 3, wherein the distributed feedback laser structure section comprises an upper clad layer comprising the first diffraction grating and an active optical waveguide comprising the gain medium,
wherein the active optical waveguide has an effective refractive index different from that of the passive optical waveguide.

5. The dual mode semiconductor laser of claim 4, wherein the distributed feedback laser structure section further comprises a first micro-heater disposed on the upper clad layer.

6. The dual mode semiconductor laser of claim 5, wherein the first micro-heater changes the effective refractive index of the active optical waveguide and the first wavelength.

7. The dual mode semiconductor laser of claim 4, where the distributed Bragg reflector laser structure section further comprises a second micro-heater disposed on the passive optical waveguide.

8. The dual mode semiconductor laser of claim 7, wherein the second micro-heater changes the effective refractive index of the passive optical waveguide and the second wavelength.

9. The dual mode semiconductor laser of claim 1, wherein the first diffraction grating has a period different from that of the second diffraction grating.

10. The dual mode semiconductor laser of claim 1, wherein the distributed feedback laser structure section comprises:
the lower clad layer on the substrate;
an active optical waveguide comprising the gain medium on the lower clad layer; and
the upper clad layer comprising the first diffraction grating on the active optical waveguide.

11. A terahertz wave apparatus, comprising:
a dual mode semiconductor laser comprising distributed feedback laser structure section oscillating a first wavelength on a substrate and a distributed Bragg reflector laser structure section oscillating a second wavelength; and a photomixer generating a terahertz wave using light oscillated from the dual mode semiconductor laser, wherein the distributed feedback laser structure section and the distributed Bragg reflector laser structure section share a same gain medium with each other, wherein the distributed feedback laser structure section comprises a first diffraction grating;

wherein the distributed Bragg reflector laser structure section comprises:
  a lower clad layer on the substrate;
  a passive optical waveguide comprising a second diffraction grating on the lower clad layer; and
  an upper clad layer on the passive optical wave guide.

12. The terahertz wave apparatus of claim 11, wherein the distributed feedback laser structure section comprises:
  the lower clad layer on the substrate;
  an active optical waveguide comprising the gain medium on the lower clad layer; and
  the upper clad layer comprising the first diffraction grating on the active optical waveguide.

* * * * *